US008234536B1

(12) United States Patent
Farjadrad et al.

(10) Patent No.: US 8,234,536 B1
(45) Date of Patent: Jul. 31, 2012

(54) ITERATIVE DECODER USING INPUT DATA PIPELINING AND TIME-INTERLEAVED PROCESSING

(75) Inventors: Ramin Farjadrad, Los Altos, CA (US); Ramin Shirani, Morgan Hill, CA (US)

(73) Assignee: Aquantia Corporation, Milpitas, CA (US)

( * ) Notice: Subject to any disclaimer, the term of this patent is extended or adjusted under 35 U.S.C. 154(b) by 950 days.

(21) Appl. No.: 12/247,833

(22) Filed: Oct. 8, 2008

Related U.S. Application Data

(63) Continuation of application No. 11/775,184, filed on Jul. 9, 2007, now abandoned.

(60) Provisional application No. 60/819,101, filed on Jul. 7, 2006.

(51) Int. Cl.
*H04L 1/18* (2006.01)

(52) U.S. Cl. ........ 714/752; 714/758; 714/776; 714/790; 375/242; 370/335

(58) Field of Classification Search .................. 714/758, 714/776, 790; 375/242; 370/335
See application file for complete search history.

(56) References Cited

U.S. PATENT DOCUMENTS

| 6,182,261 | B1* | 1/2001 | Haller et al. ................... 714/758 |
| 2003/0002588 | A1* | 1/2003 | Faller ............................ 375/242 |
| 2003/0040275 | A1* | 2/2003 | Bridgelall ....................... 455/41 |
| 2003/0135811 | A1* | 7/2003 | Xu et al. ........................ 714/790 |
| 2005/0216819 | A1* | 9/2005 | Chugg et al. .................. 714/786 |
| 2006/0013168 | A1* | 1/2006 | Agrawal et al. ............... 370/335 |
| 2006/0093023 | A1* | 5/2006 | Brown et al. .................. 375/219 |
| 2006/0224934 | A1* | 10/2006 | Cameron et al. .............. 714/752 |
| 2007/0011573 | A1* | 1/2007 | Farjadrad et al. ............. 714/760 |
| 2009/0158130 | A1* | 6/2009 | Cheun et al. .................. 714/786 |

OTHER PUBLICATIONS

Ryan, "Low-Densisty Parity-Check Codes" Jun. 2005, University of Arizona, p. 1-106.*
Sellathurai, "Turbo-Blast for Wireles Communications: Theory and Experiments", May 7, 2001, IEEE, p. 2538-2545.*
Vogt, "Increasing throughput of iterative decoders", Jun. 7, 2001, Electronic Letters, vol. 37 No. 12, p. 770-771.*
Sellathurai, "Random Space-Time Codes with Iterative Decodes for BLAST Architectures", Jun. 24, 2001, IEEE, p. 125.*
Gurswami, "Iterative Decoding of Low-Density Parity Check Codes", Sep. 2006, European Association for Theroretical Computer Science (EATCS), Issue 90, p. 1-29.*

* cited by examiner

*Primary Examiner* — Robert Beausoliel, Jr.
*Assistant Examiner* — Jeison C Arcos
(74) *Attorney, Agent, or Firm* — Lance M. Kreisman, Esq.; Mahamedi Paradice Kreisman LLP

(57) ABSTRACT

In one implementation, a decoding architecture is provided that includes an input buffer configured to receive and store one or more codewords to be processed, and a decoder coupled to the input buffer. The decoder is configured to receive a first codeword and a second codeword from the input buffer, and simultaneously process the first codeword and the second codeword such that each of the first codeword and the second codeword is processed only for a minimum amount of time for the first codeword or the second codeword to become decoded. The input buffer is further configured to load a third codeword into the decoder responsive to the first codeword or the second codeword being decoded.

14 Claims, 4 Drawing Sheets

ITERATIVE DECODER USING INPUT DATA PIPELINING AND TIME-INTERLEAVED PROCESSING

CROSS-REFERENCE TO RELATED APPLICATIONS

This application is a continuation application under 35 USC §120 and claims priority to U.S. patent application Ser. No. 11/775,184, filed Jul. 9, 2007 entitled "ITERATIVE DECODER USING INPUT DATA PIPELINING AND TIME-INTERLEAVED PROCESSING", which claims priority under 35 USC 119(e) to Provisional Application No. 60/819,101 filed on Jul. 7, 2006, the contents of each being herein incorporated by reference.

FIELD OF THE INVENTION

The present invention relates generally to data communications, and more particularly to error correction in data communications.

BACKGROUND OF THE INVENTION

An error correcting decoder is typically implemented, e.g., in a network system, to reduce communication errors. One type of an error correcting decoder is an iterative error correcting decoder. Iterative error correcting decoders typically use a large-scale parallel network of nodes performing soft probability calculation. These nodes exchange probability information of a received data block among one another. After a certain number of iterations within an iterative decoder structure, individual noisy information in a data block (or word) is transformed into an estimate of the word as a whole. Examples of iterative decoders are the low density parity check (LDPC) decoders, Hamming decoders, Turbo decoders, and the like.

The structure of an iterative error correcting decoder can be represented graphically by a factor graph. A factor graph consists of nodes and edges, where the edges represent wire connections between the nodes, and a node represents a function of its inputs. For example, in a low density parity check (LDPC) factor graph, there are two types of nodes representing two distinct functions—i.e., "equality constraint" nodes and "parity check" nodes. According to the IEEE 802.3ae (10 GBASE-T) standard, the proposed LDPC decoder consists of (2048) equality constraint nodes and (384) parity check nodes. Each equality constraint node has (6) bidirectional connections to corresponding parity constraint nodes and each parity check node has a total of (32) bidirectional connections to corresponding equality constraint nodes. This results in a factor graph with network matrix of (12,228) connections. The probabilities associated with received bit values iterate between these two node functions to finally resolve the most probable value of each data bit.

LDPC code is specified by a parity check matrix (which is commonly referred to as an H matrix) having a very few number of "ones" per row. An example H matrix 100 is shown in FIG. 1. The length of each codeword is equal to the number of columns in the H matrix 100. In one example, each codeword is created such that the parity of each set of bits corresponding to the "ones" in a row is even. The number of rows corresponds to the number of parity checks that the codeword must satisfy. Therefore, if all errors in a received codeword are corrected by the decoder, all parity checks must be satisfied for the output codeword.

An important feature of one implementation of an iterative decoder is the number of iterations that the iterative decoder can perform on an input codeword in a given amount of time as it relates to the bit error rate (BER) of the iterative decoder. A higher number of iterations results in a better BER performance of an iterative decoder. Therefore, to maximize the performance of a single iterative decoder, it is generally preferred to have a given iterative decoder perform a higher number of iterations in a certain time interval—i.e., to go through a certain number of equality constraint and parity check nodes per unit time (which determines the BER performance of the iterative decoder). Accordingly, there is a tradeoff between the number of iterations an iterative decoder can perform in a time interval of each data codeword versus the power and complexity of the iterative decoder. In a digital iterative decoder, one can increase the clock frequency, increase the gate sizes, add more flip-flops between logic stages, adopt different implementation architectures, and/or run at higher supply voltage in order to get more iterations per codeword at cost of more power. More iterations can also be achieved by pipelining two or more iterative decoders in series, so that one iterative decoder works on the decoded output codeword of the prior iterative decoder. Such an approach, however, translates into more area and power.

BRIEF SUMMARY OF THE INVENTION

In general, in one aspect, this specification describes a technique to increase the effective decoding time of a decoder (e.g., an iterative error correcting decoder) by combining an input buffer (or FIFO) together with logic that performs time-interleaved frame processing. In one implementation, a decoder including the added FIFO and logic (that performs time-interleaved frame processing) consumes significantly less power and area compared to the additional power and area in a conventional approach to reach the same performance. Accordingly, in one implementation, a decoding architecture is provided that includes an input buffer configured to receive and store one or more codewords to be processed, and a decoder coupled to the input buffer. The decoder is configured to receive a first codeword and a second codeword from the input buffer, and simultaneously process the first codeword and the second codeword such that each of the first codeword and the second codeword is processed only for a minimum amount of time for the first codeword or the second codeword to become decoded. The input buffer is further configured to load a third codeword into the decoder responsive to the first codeword or the second codeword being decoded.

Implementations can include one or more of the following features. The first codeword can be loaded into the decoder without waiting for the second codeword to be ready to be loaded into the decoder—e.g., to reduce latency. The first codeword can be loaded into the decoder simultaneously with the second codeword. The decoder architecture can further include an output buffer configured to receive and store codewords output from the decoder, in which the output buffer outputs each codeword stored in the output buffer at a fixed rate. The output buffer can output each codeword in a same order in which each codeword is loaded into the decoder. The decoder can include logic to determine when a given codeword being processed by the decoder has become decoded and generate a strobe signal that loads a next codeword from the input buffer into the decoder.

The details of one or more implementations are set forth in the accompanying drawings and the description below. Other features and advantages will be apparent from the description and drawings.

DETAILED DESCRIPTION OF THE INVENTION

Figure 1:
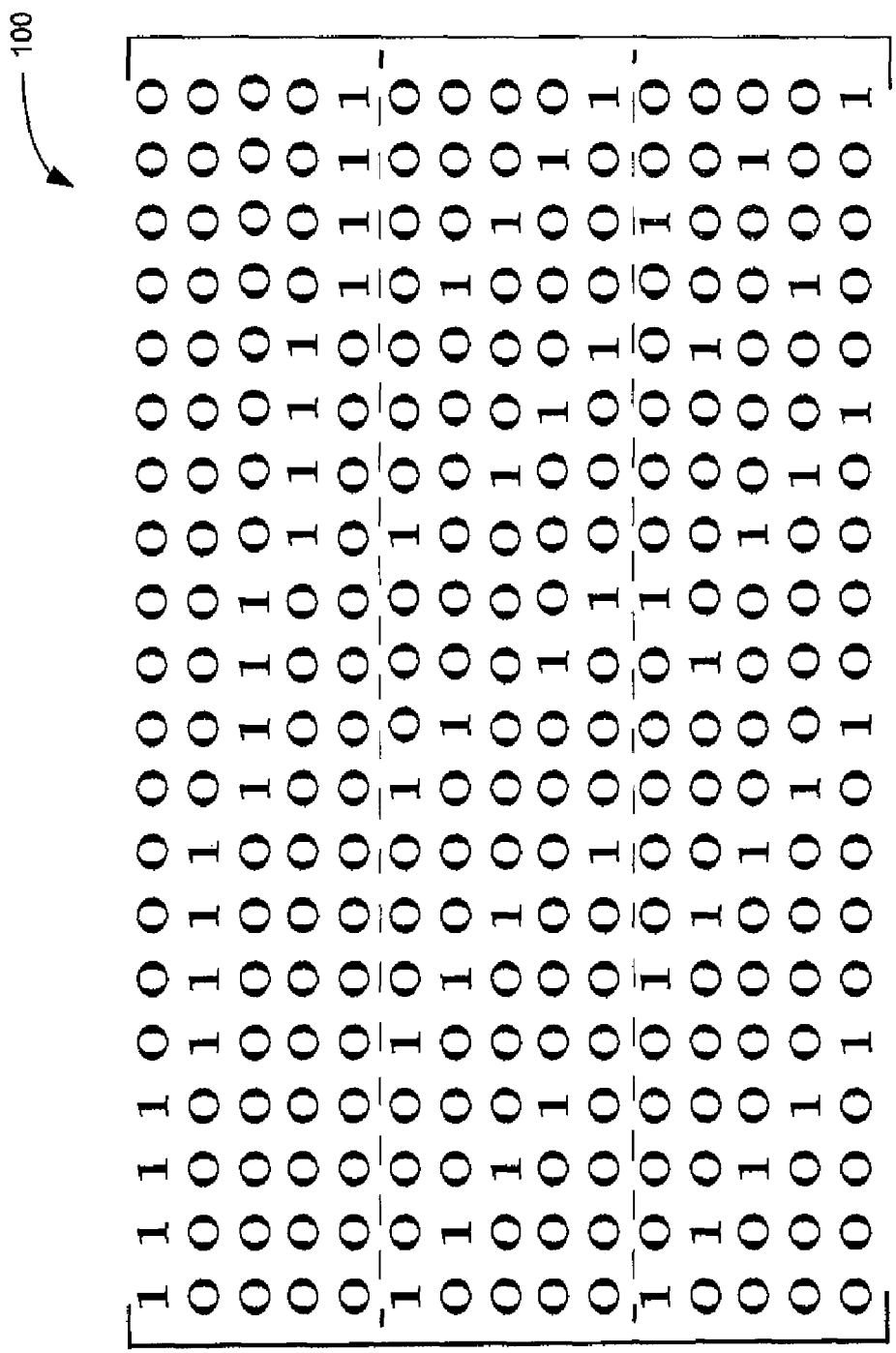
FIG. 1 is a diagram of an H matrix.

The present invention relates generally to data communications, and more particularly to error correction in data communications. The present invention is not intended to be limited to the implementations shown but is to be accorded the widest scope consistent with the principles and features described herein.

An important observation with regards to iterative decoding is that not all received codewords require the same number of iterations to become error free. The reason is due to the random nature of channel noise, not all received codewords have the same bit probabilities of one or zero—i.e., there is not the same number of errors per codeword. Conventionally, the number of iterations that an iterative decoder must perform is set (i.e., fixed) such that the worst case codeword received (given a target BER) can be fully corrected (or be error free). However, the majority of the received codewords typically require fewer iterations while a worst case codeword is rarely received, especially in very low BER systems (e.g., high SNR (signal-to-noise ratio) systems). For example, presentations to the IEEE P802.3an task force describe a minimum of 6 iterations to correct all data patterns for a BER=10E-12 scenario. Extensive LDPC simulation has shown that only one out of 1,600,000 received codewords may require 6 iterations, while after only 3 iterations fewer than one out of 5,000 codewords are still in error.

Accordingly, in one implementation, each codeword is processed in the decoder only for the minimum time required for that codeword to become error free. Since the majority of the codewords are decoded in fewer iterations or in less time relative to a worst case codeword, a conventional decoder implementation that, for example, implements 6 iterations for each received codeword will generally perform needless iterations and, therefore, experience excess decoding time. Thus, according to one implementation, excess decoding times are saved and accumulated for subsequent codewords that may require a higher decoding time. Therefore, one can set the average decoding interval at a value between the maximum required for worst case (e.g., 6 iterations) and the minimum required to decode majority of the received codewords (e.g., 3 iterations). Determining the minimum and maximum decoding times can be found empirically given the decoder H matrix and system conditions and/or application requirements. Other suitable techniques for determining the maximum and minimum decoding times can also be used.

In one implementation, to further increase speed of the processing of codewords, the decoding process of two or more codewords can be interleaved. As discussed above, an iterative decoder typically consists of two types of nodes—e.g., equality constraint nodes and parity check nodes—and the messages of a codeword iterate between these two nodes. At any given point in time, only one of the two node functions is processing a codeword, while the other node is potentially idle. For example, when parity check nodes are calculating output parity results, the equality constraint nodes that are waiting for the parity results are generally sitting idle. Thus, in one implementation, input codewords are interleaved into a decoder to effectively increase the processing speed of the decoder. Accordingly, in one implementation, input codewords are interleaved into a decoder so that when parity check nodes are processing a first codeword, the equality constraint nodes are processing a second codeword. In such an implementation, both the equality constraint nodes and parity check nodes are being used in each cycle and do not substantially remain idle.

One tradeoff of interleaving codewords into a decoder can be latency. A codeword typically consists of several messages (e.g., 10s to 1000s of messages), which are typically the output of a communication channel in which data is transmitted in serial form. Therefore, to construct a codeword that is, for example, 1000 messages wide from serially received data bits, one will need to wait for 1000 bit times. In order to have two codewords that are ready to be simultaneously loaded into a decoder, one would have to wait for 2000 bit times based on the example above. One potential disadvantage of a simple interleaving decoder is that if one of the two codewords being processed in parallel is fully decoded and error free, the codeword still cycles through the decoder until the second codeword has become fully decoded. This effectively wastes half of the cycles of the decoder. Thus, in one implementation, an input FIFO is implemented such that when a first codeword becomes fully decoded, a third codeword from the FIFO can enter the decoder during the processing of the second codeword—therefore, utilizing each cycle of the decoder effectively.

Figure 2:
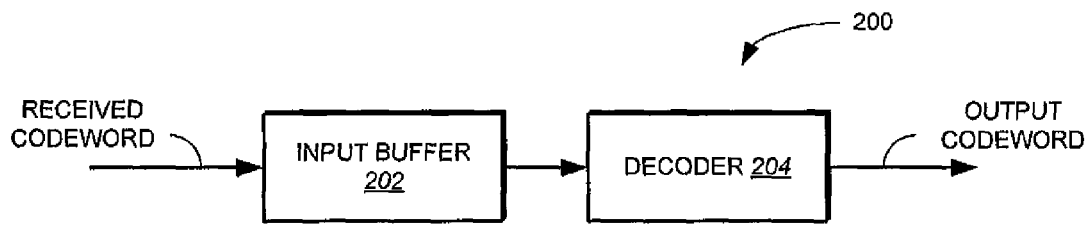
FIG. 2 is a block diagram of a decoding architecture for a decoder according to one implementation.

FIG. 2 shows a block diagram of a decoding architecture 200 in accordance with one implementation. In one implementation, the decoding architecture 200 includes an input buffer 202, and a decoder 204. The input buffer 202 is a memory that stores one or more codewords to be processed by the decoder 204. In one implementation, the input buffer is a FIFO (First-In, First-Out) buffer. In one implementation, the decoder 204 is an iterative decoder. Alternatively, the decoder 204 can be any other type of error correcting decoder that processes codewords. In one implementation, codewords are loaded into the decoder 204 from the input buffer 202 such that at any given time the decoder is simultaneously processing two or more codewords. In one implementation, the decoder 204 initially processes a first codeword for a predetermined amount of time prior to a second codeword being loaded into the decoder 204, as discussed in greater detail below. In one implementation, a plurality of input FIFOs are used to buffer codewords, one input FIFO for each decoder cycle (odd and even), as discussed in greater detail below.

Figure 3:
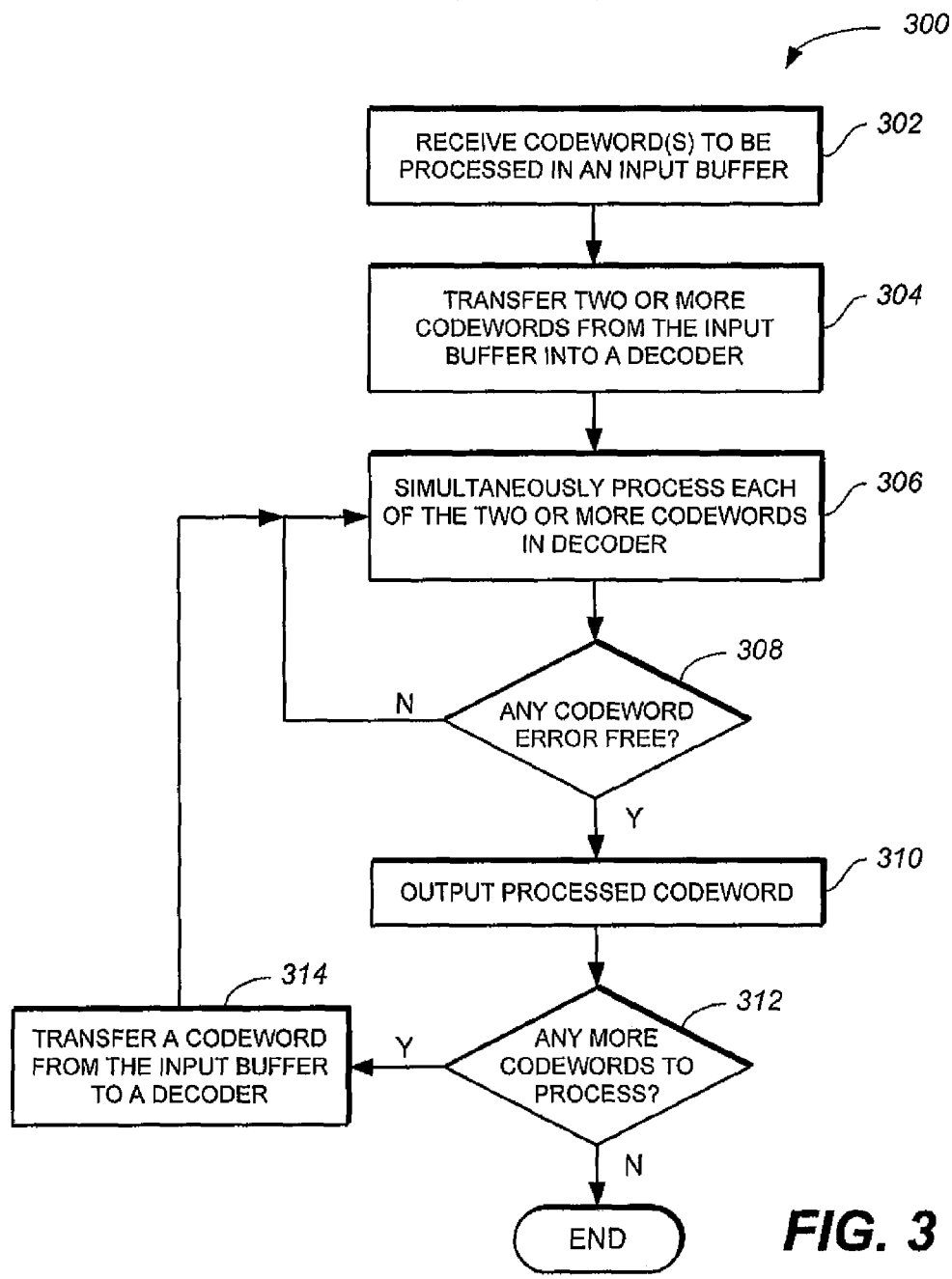
FIG. 3 illustrates a method for decoding a codeword in accordance with one implementation.

FIG. 3 shows a method 300 for processing codewords in accordance with one implementation. One or more codewords to be processed are stored in an input buffer (e.g., input buffer 202) (step 302). In one implementation, the input buffer receives codewords (to be processed by the decoder) at a rate that is at least faster than the time required for the decoder to fully correct a worst case codeword. The input buffer can receive codewords (to be processed by the decoder) at a constant or variable rate. Two or more codewords are transferred from the input buffer to a decoder (e.g., decoder 204) to be processed (step 304). In one implementation, the transferred codewords are simultaneously processed iteratively until one or more of the transferred codewords becomes error free (step 306). For example, in an implementation in which the decoder is a low density parity check (LDPC) decoder, the codewords can be processed iteratively through parity check nodes and equality constraint nodes, as discussed above. That is, in one implementation in which two codewords are being simultaneously processed in the decoder, during any given decoder cycle, one codeword will be processed by a parity check node while the other codeword is being processed by the equality constraint node.

A determination is made whether a given codeword being processed is error free (step 308). If a codeword is not yet error free, then the decoder continues to process each of the codewords (e.g., for another iteration). Once a given codeword becomes error free, the codeword is output from the decoder (step 310). A determination is made whether there are additional codewords to be processed by the decoder (step 312). If there are no additional codewords to be processed, then the method 300 ends. Otherwise, a codeword is transferred from the input buffer into the decoder (step 314), and the method 300 returns to step 306.

Figures 4A, 4B:
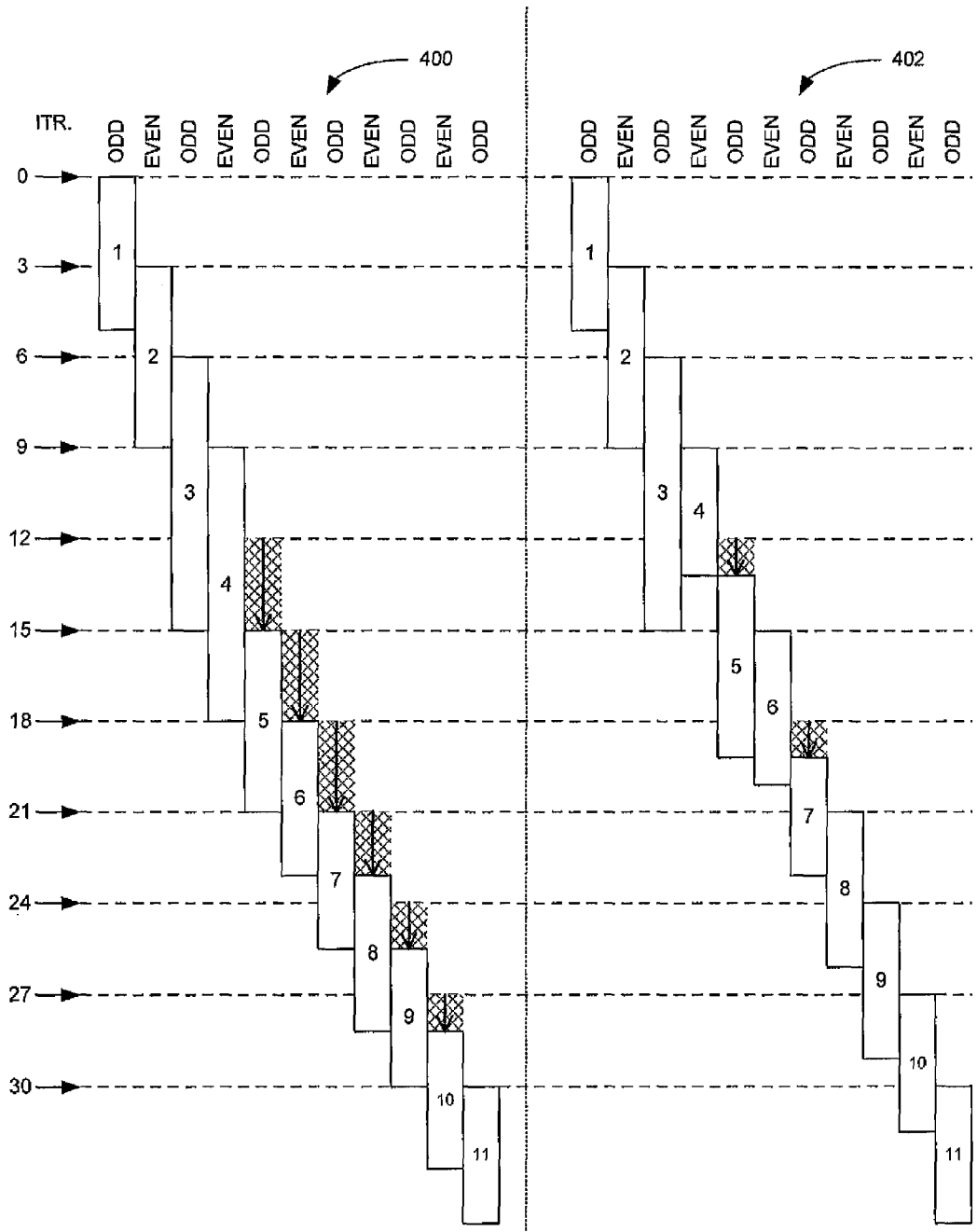
FIGS. 4A-4B illustrate example timing diagrams for the processing of codewords.

FIGS. 4A-4B respectively illustrate example timing diagrams 400, 402 of the processing of plurality of codewords in a decoder. Referring first to FIG. 4A, a first codeword (1) enters a decoding cycle as soon as the first codeword is ready to be loaded (e.g., to reduce latency). In another implementation, the loading of the first codeword into the decoder can be delayed until a second codeword is ready to be loaded into the decoder. After three iterations, a second codeword (2) is loaded into the decoder, and enters an "even" decoder cycle. At the fifth iteration, the first codeword (1) is decoded, which frees up the "odd" decoder cycle. At the sixth iteration, a third codeword (3) is loaded into the decoder in the odd decoder cycle. At the ninth iteration, the second codeword (2) is fully decoded, and a fourth codeword (4) is loaded into the decoder in the even decoder cycle.

As shown in timing diagrams 400, the third codeword (3) is not fully decoded after six iterations. Therefore, in one implementation, an input FIFO buffers a fifth codeword (5) for as long as one codeword load time, or three iterations. This buffer time permits the third codeword (3) to have an additional three iterations, or a total of nine iterations to decode. A fourth codeword (4) also takes a maximum of nine iterations to decode. In one implementation, after two codewords (one from each odd or even decoder cycle) uses up a maximum number of iterations (e.g., 9), subsequent codewords should take an equal or less than an average number of iterations (e.g., 6) to empty the input FIFO. The shaded areas in FIG. 4A shows how much of each input FIFO gets filled as the decoder processes a codeword that requires a long time to decode, and also how each input FIFO empties as the decoder received codewords (e.g., codewords 5-11) that require less time to decode.

The timing diagram 402 of FIG. 4B illustrates a case in which a decoder finishes decoding a given codeword (codeword 4) prior to a previously loaded codeword (codeword 3) has been decoded. In one implementation, as soon as either of the odd or even decoder cycles is emptied, the next codeword is loaded into the emptied cycle. Such a decoding schedule maximizes the use of the decoder cycles and minimizes a filled depth of each input FIFO. In such a case, the output of the decoder can be coupled to a smart output buffer that ensures that codewords are output in a correct order. For example, as shown in FIG. 4B, although codeword 4 is removed from the decoder prior to codeword 3, the output buffer can delay codeword 4 such that codeword 4 is output from the output buffer after codeword 3.

As shown by the timing diagrams of FIGS. 4A-4B, using a FIFO having a depth of only one (i.e., extra latency of one codeword load time) permits a decoder to perform a maximum of M iterations, while the decoder need only be fast enough to perform M/3 iterations in one codeword load time. In one implementation, increasing the FIFO depth from 1 codeword load time to a time to load n codewords, the decoder number of iterations per codeword load time can be reduced to:

$$M/(2+n) \qquad \text{e.g. (1).}$$

However, it should be noted that $2M/(2+n)$ iterations must always be greater than the average number of iterations required for decoding data in a given condition.

In one implementation, the accumulation of the excess decoding time over several codewords is an important aspect that makes every small extra (accumulated) decoding time very valuable. Thus, in one implementation, the average decoding time can be chosen close to the minimum decoding time for majority of received codewords. In such an implementation, although the excess decoding time saved in a given cycle may be small, a substantial amount of saved excess decoding can be accumulated over several cycles. Therefore, a large accumulated time can be allocated to a worst case codeword while still keeping the net average decoding cycle short.

Referring back to FIG. 2, delay accumulation can be performed using the input buffer 202 (e.g., an input FIFO buffer) to pipeline the input data codeword for a certain number of cycles. In one implementation, input data codewords are loaded into the input FIFO buffer at a fixed frequency determined by the input data rate. On the output of the input FIFO buffer, (in one implementation) every time that a codeword decoding is completed (e.g., the codeword has become error free), a strobe signal loads in the next codeword from the input FIFO buffer into the decoder. In one implementation, to avoid overflow of the input FIFO buffer, the average decoding speed is selected such that the average read speed from the input FIFO buffer is faster than the fixed write speed into the input FIFO buffer. In one implementation, the extra decoding time saved assists in emptying the input FIFO buffer which provides for more margin in cases that the decoder processes a given codeword (e.g., a worst case codeword) for a relatively long time.

In one implementation, the end of each decoding process is detected by monitoring (through logic) the output codeword for the output codeword to pass (or satisfy) all the parity checks of an H matrix. In this specific implementation, parity is checked if the logic outputs a "zero". Alternatively, parity can be checked if the logic monitoring the output codeword outputs a "one". Combinational logic can be used to perform this function and send the strobe signal to the FIFO buffer for the next read. The combinational logic can be implemented in several ways. For example, one method is to take the whole codeword, separately perform all the parity checks, and then perform a logic OR on the output of the parity check logic blocks.

Figure 5:
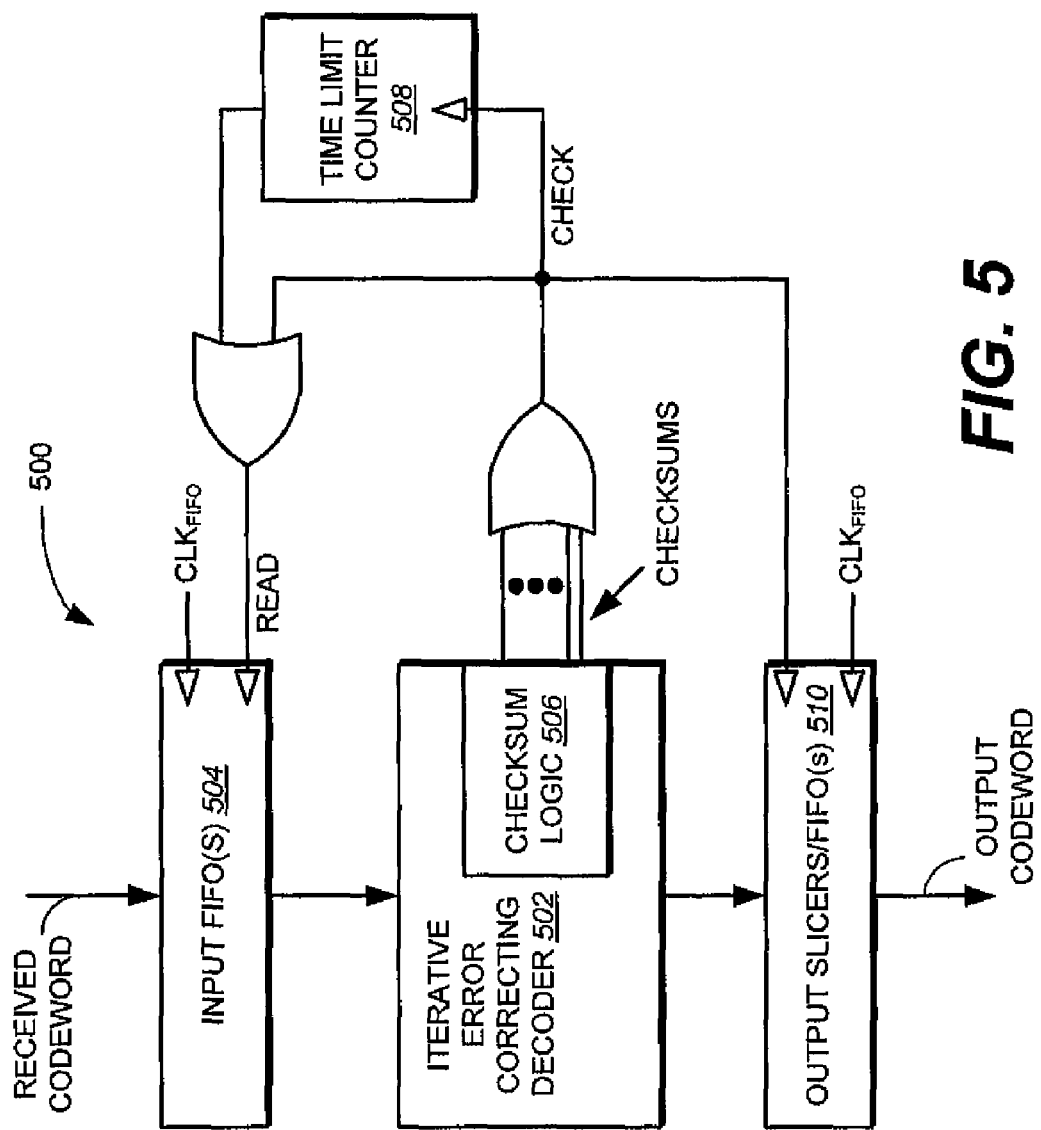
FIG. 5 is a block diagram a decoding architecture according to one implementation.
Like reference symbols in the various drawings indicate like elements.

FIG. 5 illustrates a decoder architecture 500 in accordance with one implementation of the invention. The decoder architecture 500 includes an iterative error correcting decoder 502 and one or more input FIFO buffers 504. In one implementation, iterative error correcting decoder 502 includes a checksum logic 506 that calculates the checksum for every parity check of the iterative error correcting decoder 502. In one implementation, the outputs of the checksum logic 506 are ORed together and final result is used to trigger the next read from the input FIFO buffers 504. In one implementation, to prevent certain codewords from taking a long decoding time, e.g. falling into trapping sets, the decoder architecture 500 includes a time limit counter 508 that limits the maximum decoding time of any input codeword. Once the time limit counter 508 has reached a pre-determined maximum time limit, the time limit counter 508 triggers the next read from the input FIFO buffer 504. As a result of the extra cycle time saving by using the input FIFO buffer 504, as discussed above, the iterative error correcting decoder 502 can be run at a lower frequency, which is typically about half the maximum frequency to cover the worst case correctly.

In one implementation, as shown in FIG. 5, the output of the iterative error correcting decoder 502 is coupled to an output FIFO 510 (or other suitable type of buffer memory) to guarantee output codewords can be sent from decoder architecture 500 at a fixed rate and synchronized to the FIFO clock ($Clk_{FIFO}$), which FIFO clock is used to load codewords into the input FIFO(s) 504. The inclusion of the output FIFO 510 is important for applications that require data at a fixed rate. In one implementation, the FIFO 510 further ensures that codewords are output in a proper sequence.

As a summary, the following is described in this disclosure: in one implementation, an iterative correcting decoder consisting of two sets of functionally distinct processing nodes is provided, in which each set of processing nodes simultaneously processes a codeword at a time. Such an interleaved processing of codewords can be combined with use of an input buffer (e.g., a FIFO) to further improve processing speed and increase a maximum iteration limit.

Various implementations of a decoding architecture have been described. Nevertheless, various modifications may be made to the implementations, and any variation would be within the scope of the present invention. For example, though examples described above generally described with respect to an iterative decoder, the techniques are applicable to other types of decoders. In addition, the techniques described herein can be applicable to satellite communications (e.g., DVB-S2 (Digital Video Broadcasting)), MIMO-OFDMA cellular systems, as well as read-channel for hard discs, and other systems. Accordingly, many modifications may be made without departing from the scope of the following claims.

What is claimed is:

1. A decoder architecture comprising:
    an input buffer configured to receive and store one or more codewords to be processed;
    a decoder coupled to the input buffer, the decoder configured to receive a first codeword and a second codeword from the input buffer, and simultaneously process the first codeword and the second codeword such that each of the first codeword and the second codeword is processed for time durations corresponding to actual decoding times for the first and second codewords;
    an output buffer configured to receive and store codewords output from the decoder, the output buffer to output each codeword stored in the output buffer at a fixed rate; and
    wherein the input buffer is further configured to load a third codeword into the decoder responsive to the completed decoding of the first codeword or the second codeword.

2. The decoder architecture of claim 1, wherein the first codeword is loaded into the decoder without waiting for the second codeword to be ready to be loaded into the decoder.

3. The decoder architecture of claim 1, wherein the first codeword is loaded into the decoder simultaneously with the second codeword.

4. The decoder architecture of claim 1, wherein the output buffer comprises a FIFO (First-In, First-Out) buffer to outputs each codeword in the same order in which each codeword is loaded into the decoder.

5. The decoder architecture of claim 1, wherein the decoder includes logic to determine when a given codeword being processed by the decoder has become decoded and generate a strobe signal that loads a next codeword from the input buffer into the decoder.

6. The decoder architecture of claim 5, further comprising a time limit counter configured to limit a maximum processing time of any given codeword, wherein once the time limit counter has reached a pre-determined maximum time limit, the time limit counter triggers a load of a next codeword from the input buffer into the decoder.

7. The decoder architecture of claim 1, wherein:
    the input buffer is a FIFO (First-In, First-Out) buffer; and
    the decoder is an iterative decoder.

8. The decoder architecture of claim 7, wherein the iterative decoder is one of a low density parity check (LDPC) decoder, a Hamming decoder, or a Reed-Solomon decoder.

9. A method for processing codewords, the method comprising:
    loading one or more codewords to be processed in an input buffer at a first rate;
    loading a first codeword and a second codeword into a decoder one at a time at a second rate from the input buffer, the decoder to simultaneously process the first codeword and the second codeword such that each of the first codeword and the second codeword is processed for time durations corresponding to actual decoding times for the first and second codewords;
    buffering the output from the decoder into an output FIFO buffer, and outputting each codeword from the output buffer at a fixed rate; and
    loading a third codeword into the decoder responsive to the completed decoding of the first codeword or the second codeword.

10. The method of claim 9, wherein processing a given codeword in the decoder only for a minimum amount of time for the codeword to become decoded includes generating a strobe signal that loads a next codeword from the input buffer into the decoder responsive to a determination that the given codeword being processed by the decoder has become error free.

11. The method of claim 10, wherein:
    the input buffer is a FIFO (First-In, First-Out) buffer; and
    the decoder is an iterative decoder.

12. The method of claim 11, wherein the iterative decoder is one of a low density parity check (LDPC) decoder, a Hamming decoder, or a Reed-Solomon decoder.

13. The method of claim 9, wherein the first rate and the second rate are different.

14. The decoder architecture of claim 1 wherein the decoder comprises:
    a plurality of equality constraint nodes;
    a plurality of parity check nodes; and
    an interleave path coupling the equality constraint nodes to the parity check nodes, wherein respective codewords iterate between the equality constraint nodes and the parity check nodes.

* * * * *